United States Patent
Yang

(10) Patent No.: US 8,268,717 B2
(45) Date of Patent: Sep. 18, 2012

(54) MANUFACTURING METHOD OF BUMP STRUCTURE WITH ANNULAR SUPPORT

(75) Inventor: Jing-Hong Yang, Shanghai (CN)

(73) Assignee: ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 13/209,456

(22) Filed: Aug. 15, 2011

(65) Prior Publication Data

US 2011/0300705 A1    Dec. 8, 2011

Related U.S. Application Data

(62) Division of application No. 11/693,741, filed on Mar. 30, 2007, now Pat. No. 8,030,767.

(30) Foreign Application Priority Data

Jan. 16, 2007  (CN) .......................... 2007 1 0004497

(51) Int. Cl.
*H01L 21/44* (2006.01)
(52) U.S. Cl. ............... 438/613; 257/737; 257/E21.508; 257/E23.021
(58) Field of Classification Search ........... 438/613; 257/738, E21.508, E23.021
See application file for complete search history.

(56) References Cited

U.S. PATENT DOCUMENTS

| | | | | |
|---|---|---|---|---|
| 5,268,072 A * | 12/1993 | Agarwala et al. | ............... | 216/13 |
| 5,492,235 A * | 2/1996 | Crafts et al. | ................... | 438/695 |
| 5,872,404 A * | 2/1999 | Lynch et al. | .................... | 257/781 |
| 6,602,775 B1 * | 8/2003 | Chen et al. | ..................... | 438/612 |
| 6,622,907 B2 * | 9/2003 | Fanti et al. | ..................... | 228/215 |
| 6,740,427 B2 * | 5/2004 | Datta et al. | ..................... | 428/660 |
| 6,756,294 B1 * | 6/2004 | Chen et al. | .................... | 438/612 |
| 6,930,031 B2 * | 8/2005 | Huang | ............................ | 438/612 |
| 7,262,078 B2 * | 8/2007 | Lai et al. | ........................ | 438/108 |
| 2002/0000673 A1 * | 1/2002 | Farnworth | ...................... | 257/779 |
| 2004/0229474 A1 * | 11/2004 | Tsai et al. | ...................... | 438/754 |
| 2006/0068595 A1 * | 3/2006 | Seliger et al. | ................. | 438/737 |
| 2006/0170102 A1 | 8/2006 | Ko | | |
| 2008/0185716 A1 * | 8/2008 | Huang | .......................... | 257/737 |

\* cited by examiner

*Primary Examiner* — Mary Wilczewski
*Assistant Examiner* — Toniae Thomas
(74) *Attorney, Agent, or Firm* — Jianq Chyun IP Office

(57) ABSTRACT

A manufacturing method of a bump structure with an annular support includes the following steps. A substrate including pads and a passivation layer is provided. The passivation has first openings exposing a portion of the pads. An UBM material layer is formed to cover the passivation layer and the pads. A patterned photoresist layer, having second openings respectively exposing the UBM material layer over the pads, is formed on the UBM material layer. A diameter of each second opening located on a lower surface of the patterned photoresist layer is less than that located on an upper surface of the patterned photoresist layer. Bumps are formed in the second openings. A portion of the patterned photoresist layer is removed to form an annular support at a periphery of each bump. The UBM material layer is patterned using the annular supports and the bumps as masks to form UBM layers.

14 Claims, 5 Drawing Sheets

MANUFACTURING METHOD OF BUMP STRUCTURE WITH ANNULAR SUPPORT

CROSS-REFERENCE TO RELATED APPLICATION

This application is a divisional application of and claims priority benefit of U.S. non-provisional application Ser. No. 11/693,741, filed on Mar. 30, 2007, now allowed, which claims the priority benefit of China application serial no. 200710004497.4, filed on Jan. 16, 2007. The entirety of each of the above-mentioned patent applications is hereby incorporated by reference herein and made a part of this specification.

BACKGROUND OF THE INVENTION

1. Field of the Invention

The present invention relates to a bump structure and a manufacturing method thereof, and more particularly to a bump structure with an annular support and a manufacturing method thereof.

2. Description of Related Art

Flip chip interconnect technology is a packaging technique for connecting a die to a circuit board, which is mainly conducted by forming a plurality of bumps on respective pads of the die, flipping the die over, and connecting the pads of the die to terminals on the circuit board via the bumps, such that the die is electrically connected to the circuit board through the bumps. In general, the bumps are of various types such as solder bumps, gold bumps, copper bumps, conductive polymer bumps, polymer bumps, and so forth.

FIG. 1A is a cross-sectional view of a conventional gold bump, while FIG. 1B is a top view of the conventional gold bump. Referring to FIGS. 1A and 1B, a conventional gold bump structure is adapted to be disposed on a die 110 on which a plurality of aluminum pads 120 (only one aluminum pad shown in FIGS. 1A and 1B) and a passivation layer 130 are formed. The passivation layer 130 has a plurality of openings 130a exposing a portion of each of the aluminum pads 120, respectively. In addition, the conventional gold bump structure includes an under ball metal (UBM) layer 140 and a gold bump 150. The UBM layer 140 is disposed within the opening 130a and covers a portion of the passivation layer 130. The gold bump 150 is disposed on the UBM layer 140. The gold bump 150 covers the UBM layer 140 over the portion of the passivation layer 130, resulting in formation of an annular protrusion 150a of the gold bump 150. This is called a wall effect. The annular protrusion 150a may pose an impact on the bonding strength between the gold bump 150 and other carriers (not shown). Moreover, the UBM layer 140 is disposed right below the gold bump 150. Accordingly, as cracks are formed between the UBM layer 140 and the gold bump 150, or, between the UBM layer 140 and the passivation layer 130, an under cut effect on the conventional gold bump structure can often be expected.

SUMMARY OF THE INVENTION

The present invention provides a bump structure with an annular support to reduce an under cut effect.

The present invention provides a manufacturing method of a bump structure with an annular support to sufficiently avoid a wall effect.

The present invention provides a bump structure with an annular support suitable for being disposed on a substrate. The substrate includes at least a pad and a passivation layer which has at least an opening exposing a portion of the pad. The bump structure with the annular support includes an under ball metal (UBM) layer, a bump, and an annular support. The UBM layer is disposed on the passivation layer and covers the pad exposed by the passivation layer. The bump is disposed on the UBM layer over the pad, and a diameter of a lower surface of the bump is less than the diameter of an upper surface thereof. The annular support surrounds and contacts the bump, and a material of the annular support is photoresist.

According to one embodiment of the present invention, the bump includes a head and a neck connecting the head to the UBM layer, and a diameter of the head exceeds the diameter of the neck.

According to one embodiment of the present invention, the diameter of the bump increases from the lower surface of the bump to the upper surface thereof.

According to one embodiment of the present invention, a diameter of the annular support is less than or equal to the diameter of the upper surface of the bump.

According to one embodiment of the present invention, the diameter of the annular support decreases from the upper surface of the bump to the lower surface thereof.

According to one embodiment of the present invention, the bump includes a gold bump.

The present invention provides a manufacturing method of a bump structure with an annular support. The manufacturing method includes the following steps. First, a substrate including a plurality of pads and a passivation layer is provided. The passivation has a plurality of first openings, and each of the first openings exposes a portion of the pad. Next, an UBM material layer is formed on the passivation layer so as to cover the passivation layer and the pads exposed by the passivation layer. Then, a patterned photoresist layer is formed on the UBM material layer. The patterned photoresist layer has a plurality of second openings respectively exposing the UBM material layer over the pads. A diameter of each of the second openings located on a lower surface of the patterned photoresist layer is less than the diameter of each of the second openings located on an upper surface of the patterned photoresist layer. Thereafter, a plurality of bumps is formed in the second openings. Afterwards, a portion of the patterned photoresist layer is removed to form an annular support at a periphery of each of the bumps. The UBM material layer is then patterned with use of the annular supports and the bumps as masks, such that a plurality of UBM layers is formed.

According to one embodiment of the present invention, the method of forming the patterned photoresist layer includes using a photomask to increase the diameter of each of the second openings from the lower surface of the patterned photoresist layer to the upper surface thereof.

According to one embodiment of the present invention, the photomask includes a half tone mask.

According to one embodiment of the present invention, the method of forming the patterned photoresist layer includes using a half tone mask for enabling each of the second openings to have a head and a neck. The neck connects the head to the UBM material layer, and a diameter of the head exceeds the diameter of the neck.

According to one embodiment of the present invention, the method of removing the portion of the patterned photoresist layer includes performing a dry etching process with use of the bumps as the masks.

According to one embodiment of the present invention, the dry etching process includes a plasma etching process.

According to one embodiment of the present invention, the method of removing the portion of the patterned photoresist layer includes the following steps. First, an exposure process is performed on the patterned photoresist layer with use of the bumps as the masks. Next, a developing process is performed on the exposed patterned photoresist layer so as to remove the portion of the patterned photoresist layer.

In view of the foregoing, the bump structure of the present invention has the annular support, and thus the under cut effect is not apt to happen. In addition, the bumps are formed within the opening of the passivation layer according to the present invention. Hence, the bump structure of the present invention has a planar upper surface.

In order to make the aforementioned and other objects, features and advantages of the present invention more comprehensible, several embodiments accompanied with figures are described in detail below.

DESCRIPTION OF EMBODIMENTS

First Embodiment

Figure 1A:
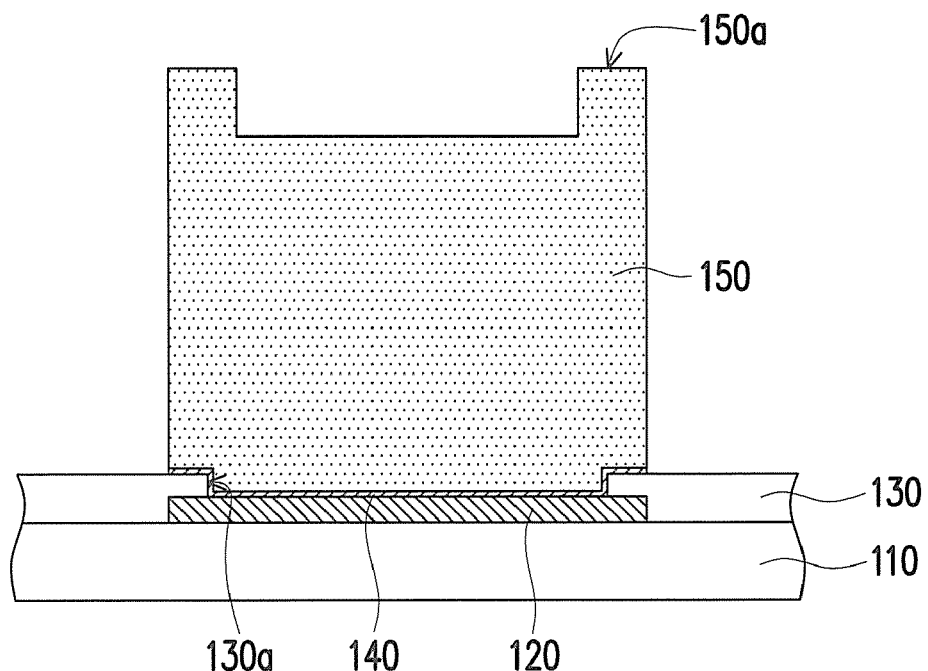
FIG. 1A is a cross-sectional view of a conventional gold bump.
Figure 1B:
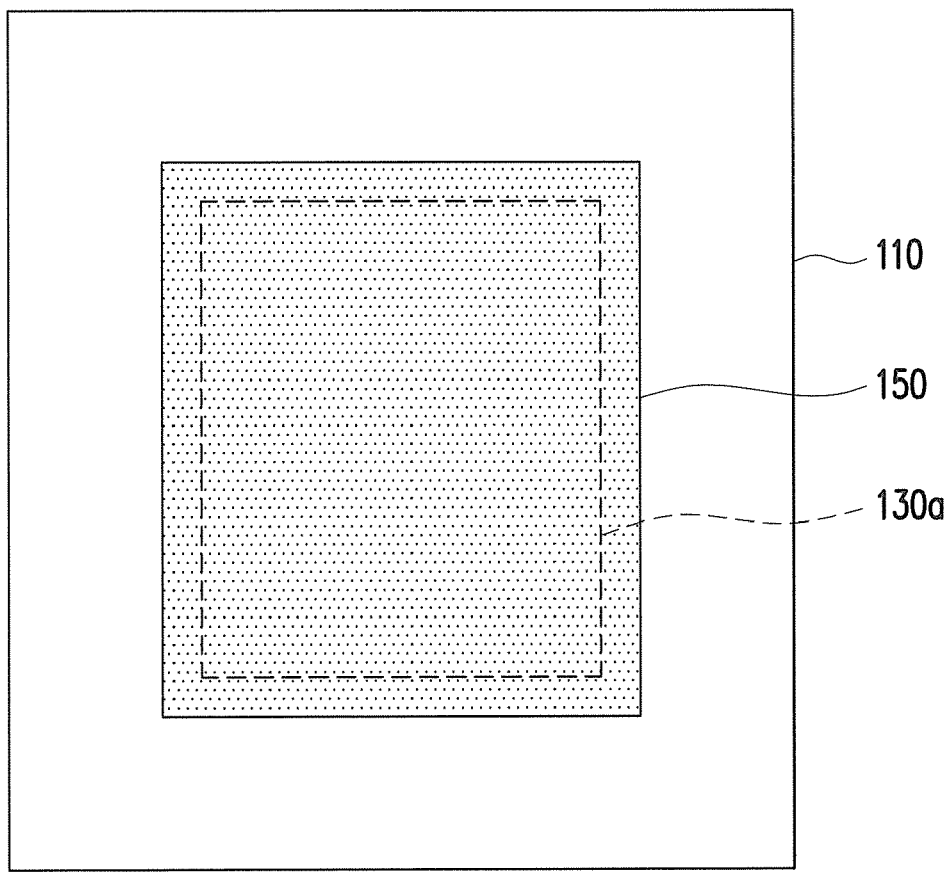
FIG. 1B is a top view of the conventional gold bump.
Figure 2A:
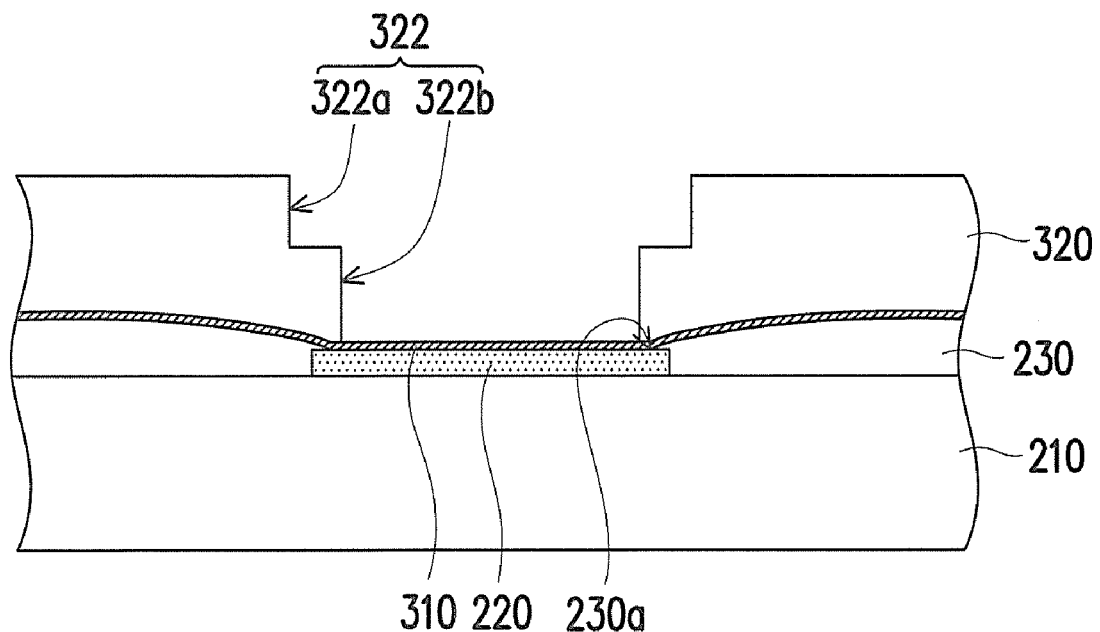
FIGS. 2A through 2D are schematic views depicting a manufacturing method of a bump structure with an annular support according to a first embodiment of the present invention.

FIGS. 2A through 2D are schematic views depicting a manufacturing method of a bump structure with an annular support according to a first embodiment of the present invention. Referring to FIG. 2A first, the manufacturing method of the bump structure with the annular support according to the present embodiment includes the following steps. First, a substrate 210 including a plurality of pads 220 and a passivation layer 230 is provided. The passivation layer 230 has a plurality of first openings 230a, and each of the first openings 230a exposes a portion of the pad 220. To better illustrate the present embodiment, it should be noted that only one of the first openings 230a and one of the pads 220 are shown in the figures. In addition, the substrate 210 may be a wafer or any other carrier, and a material of the pad 220 may be aluminum, copper, or any other metal.

Referring to FIG. 2A again, an under ball metal (UBM) material layer 310 is then formed on the passivation layer 230 so as to cover the passivation layer 230 and the pad 220 exposed by the passivation layer 230. Moreover, the method of forming the UBM material layer 310 includes implementing a sputtering process, a physical vapor deposition (PVD) process, or a chemical vapor deposition (CVD) process.

Then, a patterned photoresist layer 320 is formed on the UBM material layer 310. The patterned photoresist layer 320 has a plurality of second openings 322 respectively exposing the UBM material layer 310 over the pads 220. A diameter of each of the second openings 322 located on a lower surface of the patterned photoresist layer 320 is less than the diameter of each of the second openings 322 located on an upper surface of the patterned photoresist layer 320. Further, the method of forming the patterned photoresist layer 320 includes using a photomask (not shown). For example, the photomask is a half tone mask which is adopted to enable each of the second openings 322 to have a head 322a and a neck 322b. The neck 322b connects the head 322a to the UBM material layer 310, and a diameter of the head 322a exceeds the diameter of the neck 322b. To avoid a wall effect, the diameter of the neck 322b may be less than the diameter of the first opening 230a.

Figure 2B:
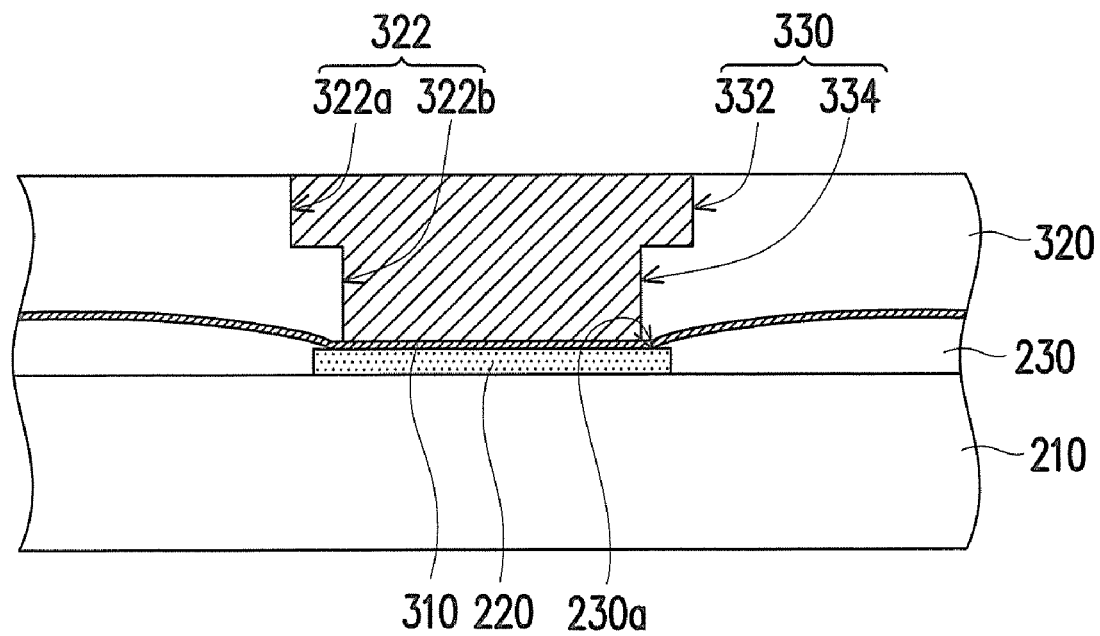

Referring to FIG. 2B, a plurality of bumps 330 is formed in the second openings 322. In other words, the bumps 330 are formed on the UBM material layer 310 over the pads 220 exposed by the passivation layer 230. A diameter of a lower surface of the bump 330 is less than the diameter of an upper surface of the bump 330. In the present embodiment, each of the bumps 330 includes a head 332 and a neck 334 connecting the head 332 to the UBM material layer 310. The diameter of the head 332 exceeds the diameter of the neck 334, while the diameter of the neck 334 is less than the diameter of the first opening 230a. Additionally, the upper surface of the head 332 is planar. The method of forming the bumps 330 may include performing an electroplating process, and the bumps 330 are, for example, gold bumps or copper bumps.

Figure 2C:
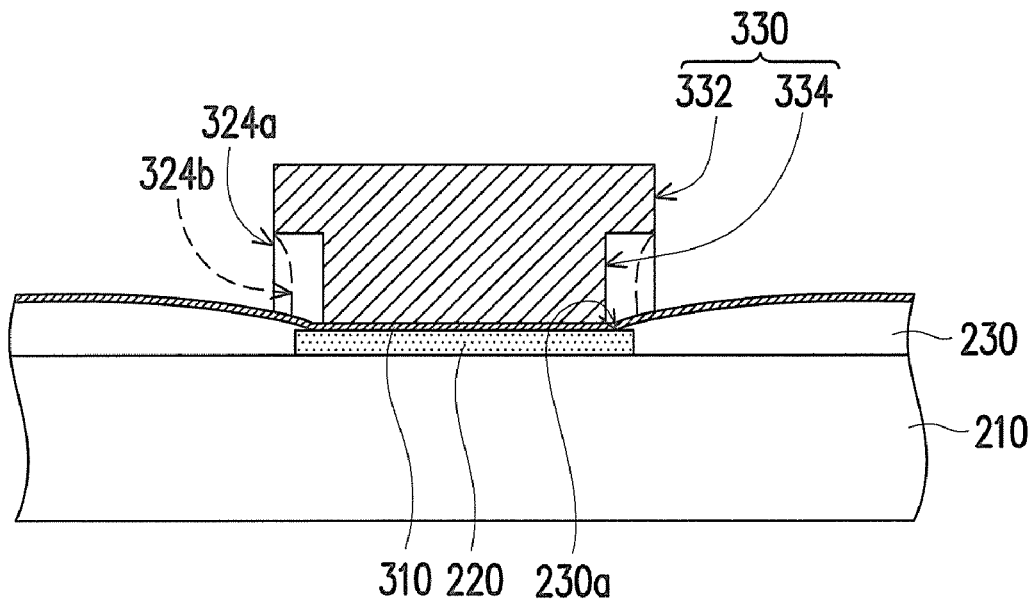

Referring to FIG. 2C, a portion of the patterned photoresist layer 320 is removed to form an annular support at a periphery of each of the bumps 330. According to different methods of removing the portion of the patterned photoresist layer 320, an annular support 324a or another annular support 324b may be formed. In addition, the method of removing the portion of the patterned photoresist layer 320 may include performing a dry etching process with use of the bumps 330 as masks. The dry etching process is, for example, a plasma etching process. If the plasma etching process is performed to remove the portion of the patterned photoresist layer 320, the annular support 324a with a vertical sidewall may be formed. That is to say, a diameter of the annular support 324a is less than and equal to the diameter of the upper surface of the bump 330.

However, it is known to people skilled in the art that other methods of removing the portion of the patterned photoresist layer 320 are available. For example, the method of removing the portion of the patterned photoresist layer 320 may include the following steps. First, an exposure process is performed on the patterned photoresist layer 320 with use of the bumps 330 as the masks. Next, a developing process is performed on the exposed patterned photoresist layer 320 so as to remove the portion of the patterned photoresist layer 320. If the exposure process and the developing process are carried out once again for removing the portion of the patterned photoresist layer 320, the annular support 324b with a recess portion may be formed; namely, the diameter of the annular support 324b decreases from the upper surface of the bump 330 to the lower surface thereof.

Figure 2D:
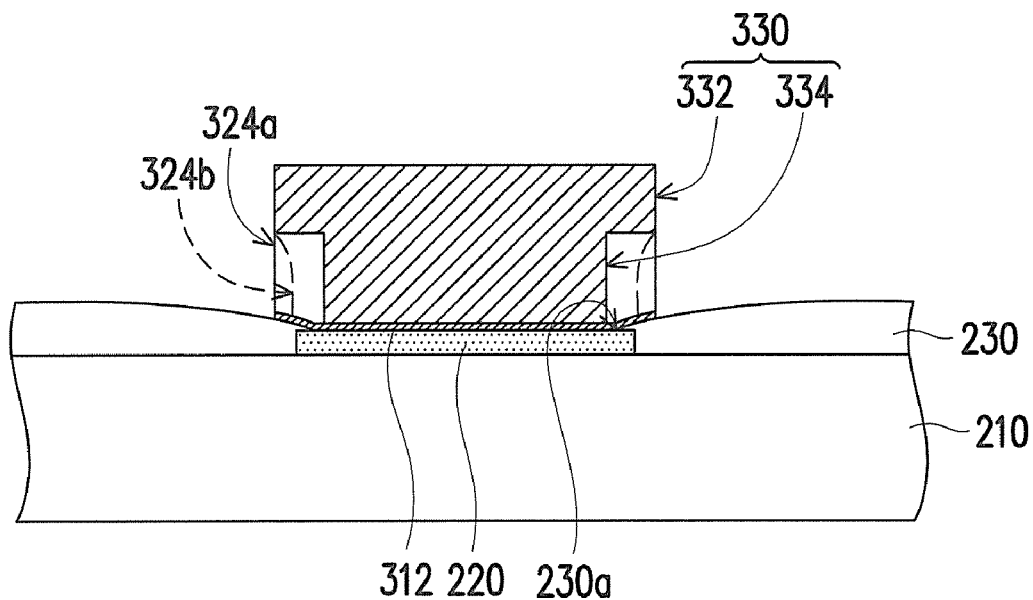

Referring to FIG. 2D, the UBM material layer 310 is then patterned with use of the annular support 324a (or 324b) and the bumps 330 as the masks, such that a plurality of UBM layers 312 is formed. Up to present, the manufacturing process of the bump structure with the annular support according to the present embodiment is basically completed. Moreover, as the substrate 210 denotes a wafer, a cutting process may also be performed on the substrate 210 after the completion of said manufacturing process, such that a plurality of die structures (not shown) is formed. A description of the detailed bump structure with the annular support is provided hereinafter.

Referring to FIG. 2D again, the bump structure with the annular support in the present embodiment is adapted to be disposed on a substrate 210 having at least a pad 220 and a passivation layer 230. The passivation layer 230 has a first opening 230a exposing a portion of the pad 220. The substrate 210 may be a die or a wafer. The bump structure with the annular support includes an UBM layer 312, a bump 330, and an annular support 324a (or 324b). The UBM layer 312 is disposed on the passivation layer 230 and covers the pad 220 exposed by the passivation layer 230.

The bump 330 is disposed on the UBM layer 312 over the pad 220, and a diameter of a lower surface of the bump 330 is less than the diameter of an upper surface thereof. According to one embodiment of the present invention, the bump 330 includes a head 332 and a neck 334 connecting the head 332 to the UBM layer 312, and a diameter of the head 332 exceeds the diameter of the neck 334. To avoid a wall effect, the diameter of the neck 334 may be less than the diameter of the first opening 230a. Additionally, a material of the bump 330 is, for example, gold or copper. The annular support 324a (or 324b) surrounds and contacts the bump 330, and a material of the annular support 324a (or 324b) is photoresist.

The bump structure of the present embodiment is equipped with the annular support 324a (or 324b) to protect the neck 334 of the bump 330, and thus an under cut effect on said bump structure is not apt to happen. Moreover, the neck 334 of the bump 330 is formed within the first opening 230a, and the diameter of the neck 334 is less than the diameter of the first opening 230a. Accordingly, the bump structure with the annular support has a planar upper surface so as to avoid the wall effect in the related art.

Second Embodiment

The same or similar reference numbers used in a second embodiment and in the first embodiment represent the same or the like elements, and the second embodiment is approximately identical to the first embodiment. The difference between the two embodiments is described hereafter, and the similarities therebetween are omitted.

The difference between the bump structure with the annular support provided in the present embodiment and the same provided in the first embodiment lies in that the bump in the present embodiment is equipped with neither a head nor a neck. Instead, a diameter of the bump in the present embodiment increases from a lower surface of the bump to an upper surface thereof.

FIGS. 3A through 3D are schematic views depicting a manufacturing method of a bump structure with an annular support according to a second embodiment of the present invention. Referring to FIG. 2A first, the manufacturing method of the bump structure with the annular support according to the present embodiment includes the following steps. First, a substrate 210 is provided. The description of the substrate 210 is clearly disclosed in the first embodiment, and thus no further explanation is provided herein.

Figure 3A:
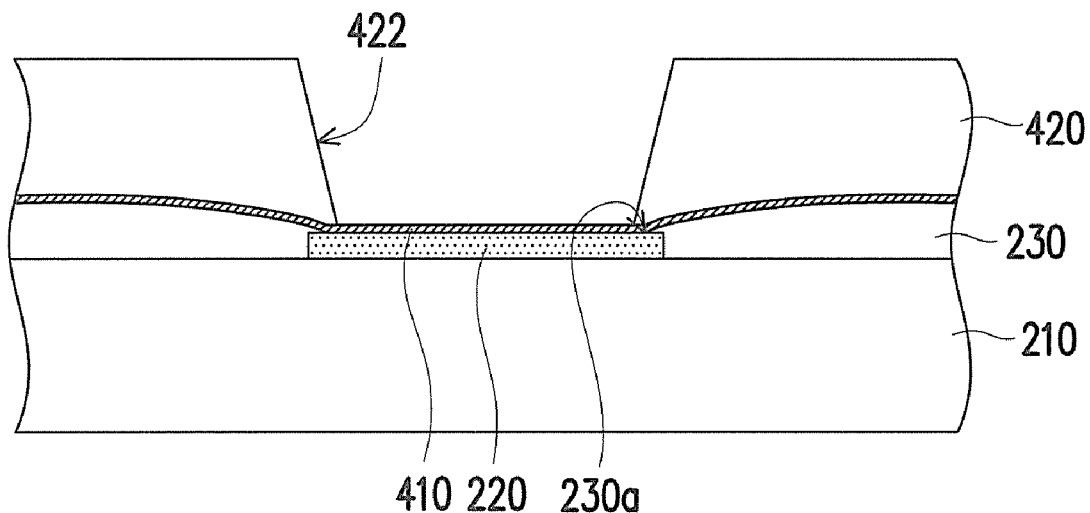
FIGS. 3A through 3D are schematic views depicting a manufacturing method of a bump structure with an annular support according to a second embodiment of the present invention.

Next, referring to FIG. 3A, an UBM material layer 410 is formed on a passivation layer 230 so as to cover the passivation layer 230 and a pad 220 exposed by the passivation layer 230. In addition, the method of forming the UBM material layer 410 may include performing a sputtering process or other PVD processes.

Then, a patterned photoresist layer 420 is formed on the UBM material layer 410. The patterned photoresist layer 420 has a plurality of second openings 422 respectively exposing the UBM material layer 410 over the pads 220. A diameter of each of the second openings 422 located on a lower surface of the patterned photoresist layer 420 is less than the diameter of each of the second openings 422 located on an upper surface of the patterned photoresist layer 420. In the present embodiment, the diameter of the second opening 422 increases from the lower surface to the upper surface, resulting in that the diameter of the lower surface of the second opening 422 is less than that of the first opening 230a. Besides, the method of forming the patterned photoresist layer 420 may include employing a half tone mask. However, the method of forming the patterned photoresist layer 420 is not limited to this. It is known to people skilled in the art that other methods of forming the patterned photoresist layer 420 are available. For example, a depth of focus of an incident light may be changed to form the second openings 422 on the patterned photoresist layer 420.

Figure 3B:
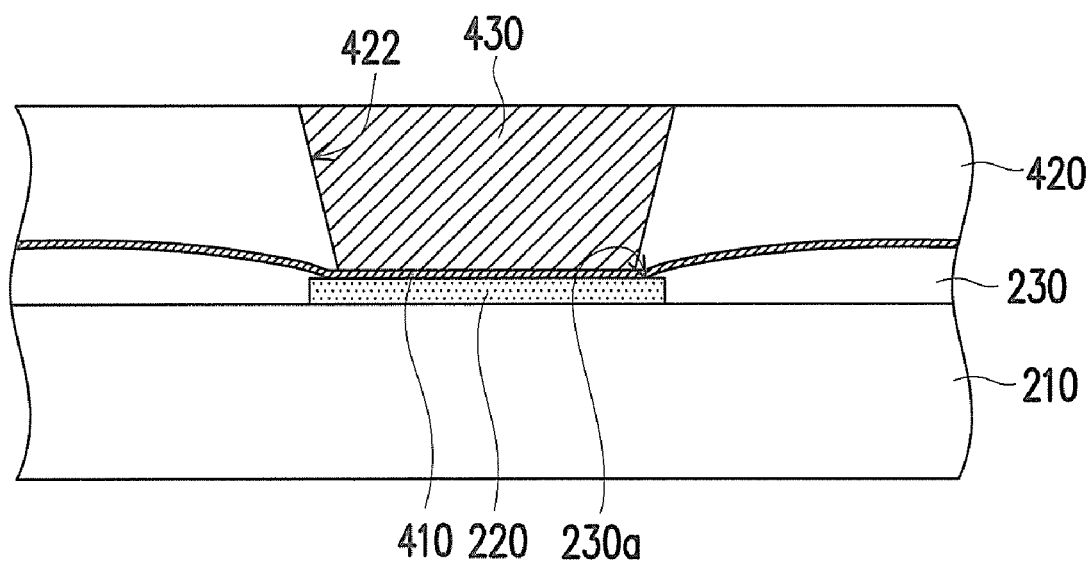

Referring to FIG. 3B, a plurality of bumps 430 is formed in the second openings 422. In other words, the bumps 430 are formed on the UBM material layer 410 over the pads 220 exposed by the passivation layer 230. A diameter of a lower surface of the bump 430 is less than the diameter of an upper surface of the bump 430. According to the present embodiment, the diameter of each of the bumps 430 increases from the lower surface of the bump 430 to the upper surface thereof. The diameter of the lower surface of the bump 430 is less than the diameter of the first opening 230a, and therefore the upper surface of the bump 430 is planar. Moreover, the method of forming the bumps 430 includes performing an electroplating process, and the bumps 430 are, for example, gold bumps or copper bumps.

Figure 3C:
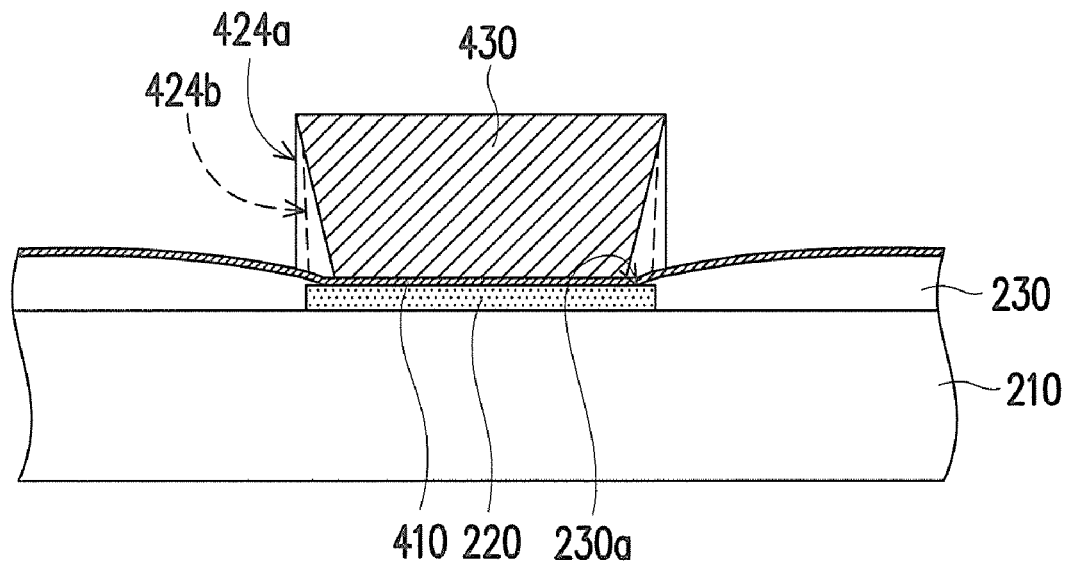

Referring to FIG. 3C, a portion of the patterned photoresist layer 420 is removed to form an annular support 424a (or 424b) at a periphery of each of the bumps 430. The method of removing the portion of the patterned photoresist layer 420 is referred to as the method of removing the portion of the patterned photoresist layer 320 according to the first embodiment. In brief, if a plasma etching process is performed to remove the portion of the patterned photoresist layer 420, the annular support 424a with a vertical sidewall may be formed. That is to say, a diameter of the annular support 424a is less than and equal to the diameter of the upper surface of the bump 430. On the other hand, if an exposure process and a developing process are carried out twice for removing the portion of the patterned photoresist layer 420, the annular support 424b with a recess portion may be formed; namely, the diameter of the annular support 424b decreases from the upper surface of the bump 430 to the lower surface thereof.

Figure 3D:
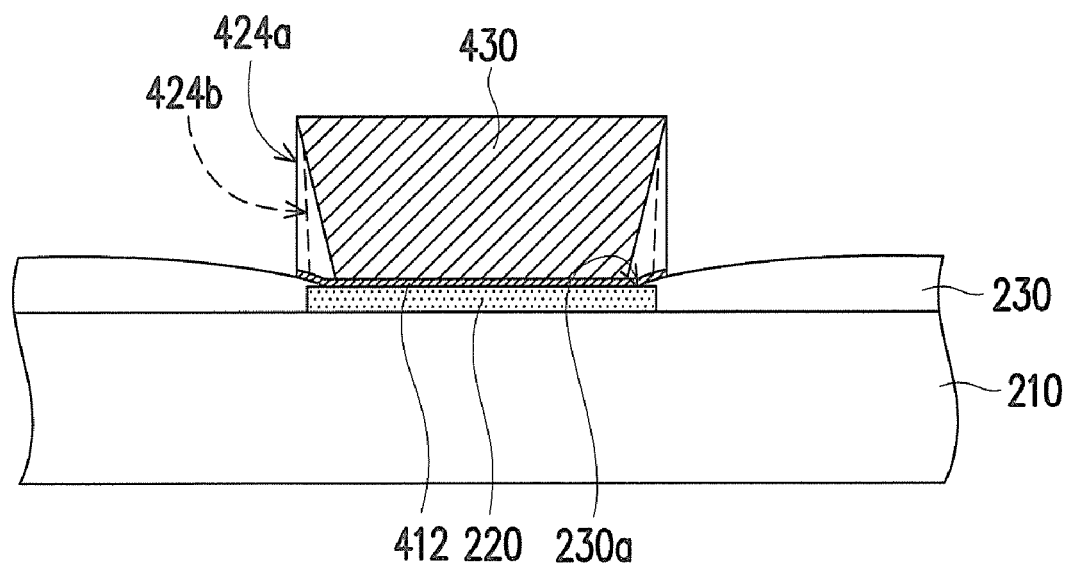

Referring to FIG. 3D, the UBM material layer 410 is then patterned with use of the annular support 424a (or 424b) and the bumps 430 as masks, such that a plurality of UBM layers 412 is formed. Up to present, the manufacturing process of the bump structure with the annular support according to the present embodiment is basically completed. Moreover, as the substrate 210 is a wafer, a cutting process may also be performed on the substrate 210, such that a plurality of die structures (not shown) is formed. Here, the difference between the bump structure with the annular support provided in the present embodiment and the bump structure with the annular support provided in the first embodiment will be demonstrated hereinafter.

Referring to FIGS. 2D and 3D, the difference between the bump structure with the annular support provided in the present embodiment and the bump structure with the annular support provided in the first embodiment lies in that the bump 430 in the present embodiment is not equipped with a head 332 and a neck 334 as is the bump 330. The diameter of the bump 430 increases from the lower surface of the bump 430 to the upper surface thereof, and an inner diameter of the annular support 424a (or 424b) also increases from the lower surface of the annular support 424a (or 424b) to the upper surface thereof.

Based on above, the present invention at least has the following advantages:

1. The bump structure of the present invention has the annular support, and thus the under cut effect on said bump structure is not apt to happen.

2. The bumps are formed within the openings of the passivation layer according to the present invention. Hence, the bump structure of the present invention has the planar upper surface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a bump structure with an annular support, comprising:
    providing a substrate having a plurality of pads and a passivation layer having a plurality of first openings, each of the first openings exposing a portion of the pad;
    forming an under ball metal (UBM) material layer on the passivation layer so as to cover the passivation layer and the pads exposed by the passivation layer;
    forming a patterned photoresist layer on the UBM material layer, wherein the patterned photoresist layer has a plurality of second openings respectively exposing the UBM material layer over the pads, and a diameter of each of the second openings located on a bottom surface of the patterned photoresist layer is less than the diameter of each of the second openings located on a top surface of the patterned photoresist layer;
    forming a plurality of bumps in the second openings;
    removing a portion of the patterned photoresist layer so as to form an annular support at a periphery of each of the bumps, wherein a diameter of each of the annular supports is less than or equal to a diameter of a top surface of each of the bumps, such that each of the annular supports is arranged merely within a vertical projection of each of the bumps on a horizontal plane, and wherein an entire bottom surface of each of the bumps surrounded by the corresponding annular support is disposed within the first openings, and a portion of a bottom surface of each of the annular supports is disposed within the first openings; and
    patterning the UBM material layer with use of the annular supports and the bumps as masks, such that a plurality of UBM layers is formed, wherein an outer peripheral edge of each of the annular supports is aligned with an edge of each of the UBM layers, and an outer peripheral edge of the top surface of each of the bumps is aligned with the outer peripheral edge of each of the annular supports.

2. The manufacturing method of claim 1, wherein the method of forming the patterned photoresist layer comprises using a photomask to increase the diameter of each of the second openings from the lower surface of the patterned photoresist layer to the upper surface thereof.

3. The manufacturing method of claim 2, wherein the photomask comprises a half tone mask.

4. The manufacturing method of claim 1, wherein the method of forming the patterned photoresist layer comprises using a half tone mask for enabling each of the second openings to have a head and a neck connecting the head to the UBM material layer, a diameter of the head exceeding the diameter of the neck.

5. The manufacturing method of claim 1, wherein the method of removing the portion of the patterned photoresist layer comprises performing a dry etching process with use of the bumps as the masks.

6. The manufacturing method of claim 5, wherein the dry etching process comprises a plasma etching process.

7. The manufacturing method of claim 1, wherein the method of removing the portion of the patterned photoresist layer comprises:
    performing an exposure process on the patterned photoresist layer with use of the bumps as the masks; and
    performing a developing process on the exposed patterned photoresist layer so as to remove the portion of the patterned photoresist layer.

8. A manufacturing method of a bump structure with an annular support, comprising:
    providing a substrate having a plurality of pads and a passivation layer having a plurality of first openings, each of the first openings exposing a portion of the pad;
    forming an under ball metal (UBM) material layer on the passivation layer so as to cover the passivation layer and the pads exposed by the passivation layer;
    forming a patterned photoresist layer on the UBM material layer, wherein the patterned photoresist layer has a plurality of second openings respectively exposing the UBM material layer over the pads, and a diameter of each of the second openings located on a bottom surface of the patterned photoresist layer is less than the diameter of each of the second openings located on a top surface of the patterned photoresist layer;
    forming a plurality of bumps in the second openings;
    removing a portion of the patterned photoresist layer so as to form an annular support at a periphery of each of the bumps, wherein a diameter of an outer periphery of each of the annular supports is less than or equal to a diameter of a top surface of each of the bumps, and wherein an entire bottom surface of each of the bumps surrounded by the corresponding annular support is disposed within the first openings, and a portion of a bottom surface of each of the annular supports is disposed within the first openings; and
    patterning the UBM material layer with use of the annular supports and the bumps as masks, such that a plurality of UBM layers is formed, wherein an outer peripheral edge of each of the annular supports is aligned with an edge of each of the UBM layers, and an outer peripheral edge of the top surface of each of the bumps is aligned with the outer peripheral edge of each of the annular supports.

9. The manufacturing method of claim 8, wherein the method of forming the patterned photoresist layer comprises using a photomask to increase the diameter of each of the second openings from the lower surface of the patterned photoresist layer to the upper surface thereof.

10. The manufacturing method of claim 9, wherein the photomask comprises a half tone mask.

11. The manufacturing method of claim 8, wherein the method of forming the patterned photoresist layer comprises using a half tone mask for enabling each of the second openings to have a head and a neck connecting the head to the UBM material layer, a diameter of the head exceeding the diameter of the neck.

12. The manufacturing method of claim 8, wherein the method of removing the portion of the patterned photoresist layer comprises performing a dry etching process with use of the bumps as the masks.

13. The manufacturing method of claim 12, wherein the dry etching process comprises a plasma etching process.

14. The manufacturing method of claim 8, wherein the method of removing the portion of the patterned photoresist layer comprises:
    performing an exposure process on the patterned photoresist layer with use of the bumps as the masks; and
    performing a developing process on the exposed patterned photoresist layer so as to remove the portion of the patterned photoresist layer.

* * * * *